United States Patent
Waller et al.

[11] Patent Number: 6,005,813
[45] Date of Patent: Dec. 21, 1999

[54] DEVICE AND METHOD FOR REPAIRING A SEMICONDUCTOR MEMORY

[75] Inventors: William K. Waller, Garland, Tex.; Huy T. Vo, Boise, Id.

[73] Assignee: Micron Technology, Inc., Boise, Id.

[21] Appl. No.: 08/968,439

[22] Filed: Nov. 12, 1997

[51] Int. Cl.⁶ .................................................. G11C 7/00
[52] U.S. Cl. ................ 365/200; 365/201; 365/225.7; 365/230.03
[58] Field of Search .................. 365/200, 201, 365/225.7, 230.03

[56] References Cited

U.S. PATENT DOCUMENTS

| | | | |
|---|---|---|---|
| 4,459,685 | 7/1984 | Sud et al. | 365/200 |
| 4,598,388 | 7/1986 | Anderson | 365/200 |
| 4,601,019 | 7/1986 | Shah et al. | 365/200 |
| 5,031,151 | 7/1991 | Fifield et al. | 365/195 |
| 5,257,229 | 10/1993 | McClure et al. | 365/200 |
| 5,268,866 | 12/1993 | Feng et al. | 365/200 |
| 5,270,976 | 12/1993 | Tran | 365/200 |
| 5,287,310 | 2/1994 | Schreck et al. | 365/189.05 |
| 5,299,164 | 3/1994 | Takeuchi et al. | 365/201 |
| 5,355,340 | 10/1994 | Coker et al. | 365/200 |
| 5,359,560 | 10/1994 | Suh et al. | 365/200 |
| 5,396,124 | 3/1995 | Sawada et al. | 326/13 |
| 5,422,850 | 6/1995 | Sukegawa et al. | 365/200 |
| 5,471,426 | 11/1995 | McClure | 365/200 |
| 5,502,674 | 3/1996 | Griffus et al. | 365/200 |
| 5,511,028 | 4/1996 | Nam | 365/200 |
| 5,528,539 | 6/1996 | Ong et al. | 365/200 |
| 5,544,106 | 8/1996 | Koike | 365/200 |
| 5,572,470 | 11/1996 | McClure et al. | 365/200 |
| 5,572,471 | 11/1996 | Proebsting | 365/200 |
| 5,583,463 | 12/1996 | Merritt | 327/526 |
| 5,646,896 | 7/1997 | Pinkham | 365/200 |
| 5,708,619 | 1/1998 | Gillingham | 365/230.06 |

*Primary Examiner*—David Nelms
*Assistant Examiner*—Tuan T. Nguyen
*Attorney, Agent, or Firm*—Trask, Britt & Rossa

[57] ABSTRACT

A redundancy architecture for repairing a DRAM includes fuse banks for storing the row addresses of defective rows in sub-arrays of the DRAM. Row decoders activate a redundant row in one of the sub-arrays in response to receiving a row address matching one of the stored defective row addresses and, at the same time, disable a redundant row in the other of the sub-arrays that is arranged in an order complementary to that of the activated redundant row. By activating a redundant row in one sub-array and disabling the corresponding redundant row in an adjacent sub-array, the architecture allows for repairs to be conducted in the one sub-array while a good row in the adjacent sub-array is allowed to continue in operation. Also, since the redundant row used for repairs in the one sub-array is typically nearest the center of the sub-array, the disabled redundant row in the adjacent sub-array is nearest the edge of that sub-array, because it is arranged in an order complementary to that of the redundant row used for repairs. As a result, the disabled redundant row acts as an edge buffer between the primary and redundant rows of the adjacent sub-array and peripheral circuitry.

11 Claims, 3 Drawing Sheets

DEVICE AND METHOD FOR REPAIRING A SEMICONDUCTOR MEMORY

BACKGROUND OF THE INVENTION

1. Technical Field

This invention relates to memory cell redundancy in semiconductor memories.

2. State of the Art

Semiconductor memories generally include a multitude of memory cells arranged in rows and columns. Each memory cell is capable of storing digital information in the form of a "1" or a "0" bit. To write (i.e., store) a bit into a memory cell, a binary memory address having portions identifying the cell's row (the "row address") and column (the "column address") is provided to addressing circuitry in the semiconductor memory to activate the cell, and the bit is then supplied to the cell. Similarly, to read (i.e., retrieve) a bit from a memory cell, the cell is again activated using the cell's memory address, and the bit is then output from the cell.

Semiconductor memories are typically tested after they are fabricated to determine if they contain any failing memory cells (i.e., cells to which bits cannot be dependably written or from which bits cannot be dependably read). Generally, when a semiconductor memory is found to contain failing memory cells, an attempt is made to repair the memory by replacing the failing memory cells with redundant memory cells provided in redundant rows or columns in the memory.

Conventionally, when a redundant row is used to repair a semiconductor memory containing a failing memory cell, the failing cell's row address is permanently stored (typically in pre-decoded form) on a chip on which the semiconductor memory is fabricated by programming a non-volatile element (e.g., a group of fuses, anti-fuses, or FLASH memory cells) on the chip. Then, during normal operation of the semiconductor memory, if the memory's addressing circuitry receives a memory address including a row address that corresponds to the row address stored on the chip, redundant circuitry in the memory causes a redundant memory cell in the redundant row to be accessed instead of the memory cell identified by the received memory address. Since every memory cell in the failing cell's row has the same row address, every cell in the failing cell's row, both operative and failing, is replaced by a redundant memory cell in the redundant row.

Similarly, when a redundant column is used to repair the semiconductor memory, the failing cell's column address is permanently stored (typically in pre-decoded form) on the chip by programming a non-volatile element on the chip. Then, during normal operation of the semiconductor memory, if the memory's addressing circuitry receives a memory address including a column address that corresponds to the column address stored on the chip, redundant circuitry in the memory causes a redundant memory cell in the redundant column to be accessed instead of the memory cell identified by the received memory address. Since every memory cell in the failing cell's column has the same column address, every cell in the failing cell's column, both operative and failing, is replaced by a redundant memory cell in the redundant column.

The process described above for repairing a semiconductor memory using redundant rows and columns is well known in the art, and is described in various forms in U.S. Pat. Nos. 4,459,685, 4,598,388, 4,601,019, 5,031,151, 5,257,229, 5,268,866, 5,270,976, 5,287,310, 5,355,340, 5,396,124, 5,422,850, 5,471,426, 5,502,674, 5,511,028, 5,544,106, 5,572,470, 5,572,471, and 5,583,463.

From the discussion of semiconductor memories thus far, it may appear that such memories comprise one large array of memory cells. This is true as far as other electronic devices are concerned, because such devices typically interact with a semiconductor memory as if it were a single array of memory cells arranged in as many rows and columns (referred to as "global" rows and columns) as are uniquely addressable by the memory's row and column addresses.

However, internally, a modern semiconductor memory most often comprises multiple sub-arrays of memory cells, each containing "local" rows and columns that are portions of the memory's global rows and columns. Thus, for example, a 1 MB semiconductor memory addressable with 1,024 unique row and column addresses typically comprises four 256 KB sub-arrays, with each sub-array containing 512 local rows and columns, and each local row or column being one-half of a global row or column. As a result, each row address provided to the semiconductor memory uniquely addresses a global row comprised of two local rows in separate sub-arrays, and each column address provided to the memory then uniquely addresses a memory cell in one of the sub-arrays.

In such a semiconductor memory, because row addresses only uniquely address global rows, and do not uniquely address local rows, all local rows that make up a particular global row are activated when that global row is addressed. Similarly, all of the local rows that make up a global row are disabled and replaced with local redundant rows in their respective sub-arrays when a defective memory cell is found anywhere in the global row. Thus, for example, in the case of the 1 MB semiconductor memory discussed above, a defective memory cell in a local row of one sub-array is repaired by replacing the local row with a local redundant row in the sub-array. At the same time, however, a local row in an adjacent sub-array is also replaced with a local redundant row in that sub-array, despite the fact that the local row in the adjacent sub-array has no defects. This occurs because the addressing scheme of the semiconductor memory does not allow local rows to be uniquely addressed.

The conventional redundancy architecture described above is illustrated in FIG. 1. In normal operation, row decoders <0> and <1> activate selected wordline signals, and thereby activate selected rows within adjacent sub-arrays <0> and <1>, in accordance with row addresses they receive. Thus, when a row address selects a particular global row comprised of local rows in the sub-arrays <0> and <1>, row decoders <0> and <1> fire the wordline signals necessary to activate those local rows. Data is then written to, or read from, a memory cell in one of the sub-arrays <0> and <1> selected in accordance with a column address.

If a defective memory cell 10 is found in a local row LR_32 of the sub-array <0>, for example, then the row address of the global row with which the local row LR_32 is associated is stored in fuse banks 12. During subsequent memory operations, when a received row address matches the row address stored in the fuse banks 12, match signals output by the fuse banks 12 direct the row decoders <0> and <1> to not activate the local rows LR_32 in sub-arrays <0> and <1> and, instead, to activate redundant rows RR_0 in sub-arrays <0> and <1>. As a result, the defective memory cell 10 is repaired.

It can be seen from this description that a few defective memory cells in either of the sub-arrays <0> and <1> will very quickly use up the redundant rows RR_0, RR_1, RR_2, and RR_3 available in the sub-arrays <0> and <1>. Since redundant rows are typically formed at the edge of sub-arrays, a few repairs thus very quickly make such sub-arrays dependent on rows positioned right at their edges for normal operations. Since "edge" rows are more likely to have various fabrication errors and are more likely to be affected by the operations of peripheral circuitry, it is undesirable to have sub-arrays routinely dependent for normal operations on edge rows. This is especially true when the local row replaced (e.g., the local row LR_32 in the sub-array <1>) has no defective memory cells, and yet is still replaced with a redundant row (e.g., the redundant row RR_0 of the sub-array <1>) near the edge.

Therefore, there is a need in the art for a device and method for repairing a semiconductor memory that does not require the replacement of a good local row in a sub-array with a redundant row in that sub-array simply because a bad local row in an adjacent sub-array needs to be replaced with a redundant row in the adjacent sub-array. Also, there is a need for a device and method of conducting repairs that limits the use of redundant rows at the extreme edges of sub-arrays so that repairs can be more reliable.

SUMMARY OF THE INVENTION

An inventive redundancy architecture for repairing a semiconductor memory, such as a Dynamic Random Access Memory (DRAM), includes circuitry for storing the row addresses of defective rows in sub-arrays of the memory. Such circuitry may include fuse banks, for example, or other non-volatile elements, such as anti-fuses or flash EEPROM cells. The circuitry also activates a redundant row in one of the sub-arrays in response to receiving a row address matching one of the stored defective row addresses and, at the same time, disables a redundant row in the other of the sub-arrays that is arranged in an order complementary to that of the activated redundant row. Thus, the circuitry may also include row decoders associated with each of the sub-arrays.

By activating a redundant row in one sub-array and disabling the corresponding redundant row in an adjacent sub-array, the present invention allows for repairs to be conducted in the one sub-array while a good row in the adjacent sub-array is allowed to continue in operation. Also, since the redundant row used for repairs in the one sub-array is typically nearest the center of the sub-array, the disabled redundant row in the adjacent sub-array is nearest the edge of that sub-array, because it is arranged in an order complementary to that of the redundant row used for repairs. As a result, the disabled redundant row acts as an edge buffer between the primary and redundant rows of the adjacent sub-array and peripheral circuitry.

In other embodiments of this invention the redundancy architecture described above is incorporated into a semiconductor memory, a DRAM, a semiconductor wafer, and an electronic system.

In a redundancy method in accordance with this invention, row addresses of defective rows in a pair of sub-arrays in a semiconductor memory are stored. A redundant row in one of the sub-arrays is then activated in response to receiving a row address matching one of the stored defective row addresses. At the same time, activation of a redundant row arranged in the other of the sub-arrays in an order complementary to that of the activated redundant row is disabled.

DETAILED DESCRIPTION OF THE ILLUSTRATED EMBODIMENTS

Figure 1:
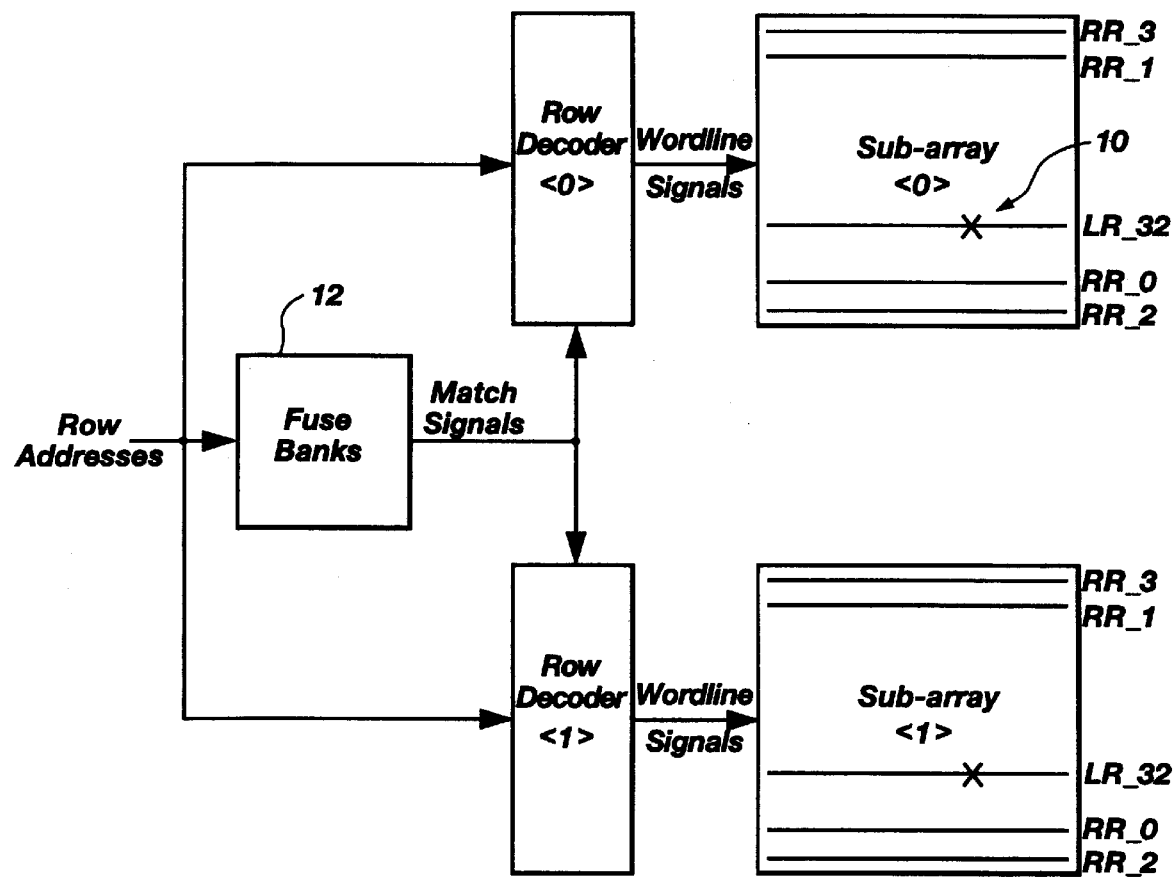
FIG. 1 is a block diagram of a conventional redundancy architecture in a semiconductor memory.
Figure 2:
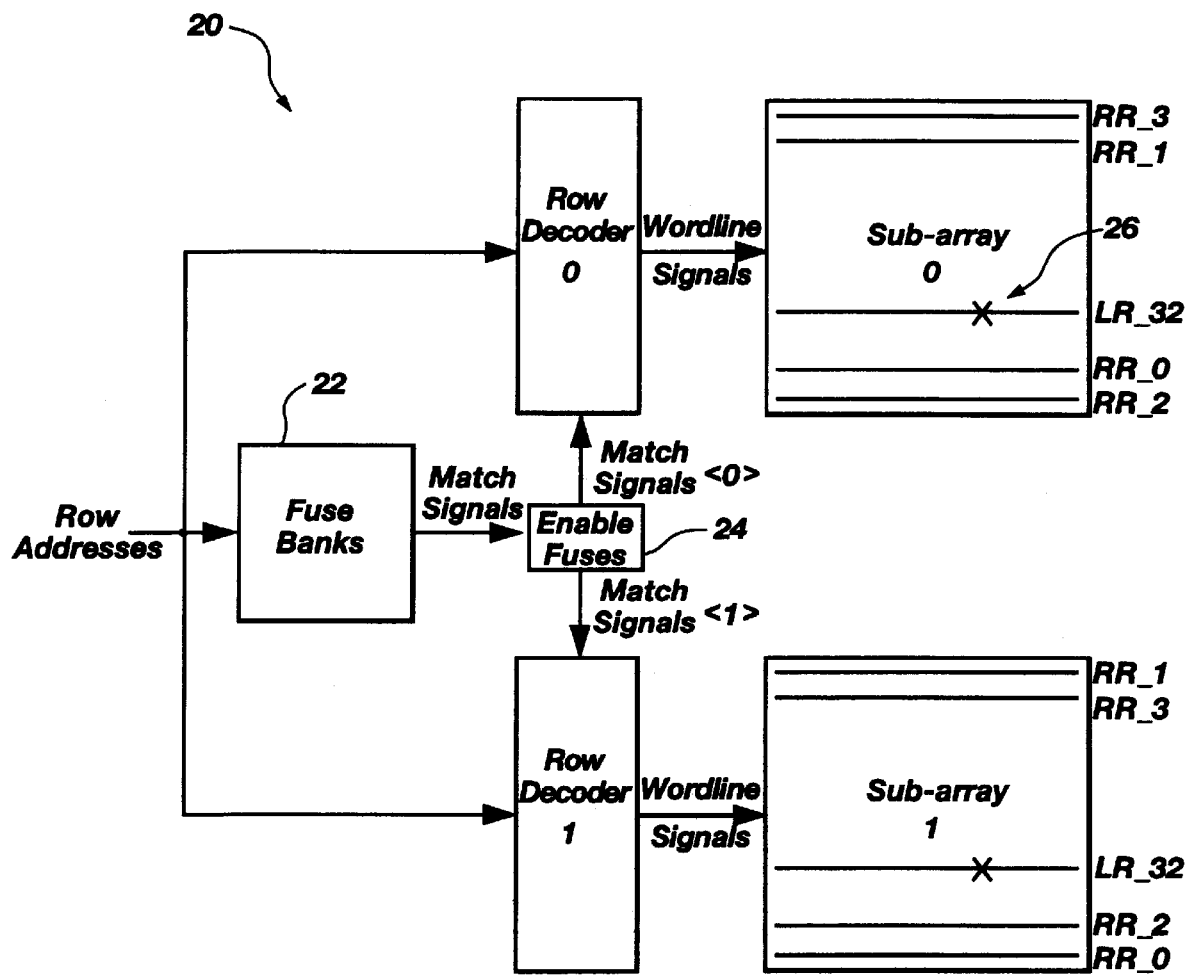
FIG. 2 is a block diagram of a redundancy architecture in accordance with this invention.

As shown in FIG. 2, a redundancy architecture 20 in accordance with this invention includes row decoders <0> and <1> for activating selected wordline signals, and thereby activating selected local rows in sub-arrays <0> and <1>, in accordance with received row addresses. The row addresses of defective memory cells in either of the sub-arrays <0> and <1> are stored using fuses in fuse banks 22. Of course, other nonvolatile elements may be used in place of fuses to store the row addresses, including, for example, anti-fuses and FLASH memory cells.

When the fuse banks 22 receive row addresses that match stored row addresses, the fuse banks 22 output match signals to enable fuses 24. Although the enable fuses 24 are shown in FIG. 2 as being separate from the fuse banks 22, they can also be implemented within the fuse banks 22. For each of the match signals, one of the enable fuses 24 is blown in accordance with this invention so that repair is enabled in only one of the sub-arrays <0> and <1> by match signals <0> and match signals <1>.

Thus, for example, when a defective memory cell 26 is found in a local row LR_32 within the sub-array <0>, the row address of the global row associated with the defective memory cell 26 is stored in the fuse banks 22. At the same time, one of the enable fuses 24 is blown so that one of the match signals <0> will cause the row decoder <0> to disable the local row LR_32 of the sub-array <0> while enabling a redundant row RR_0 of the sub-array <0>, and so that one of the match signals <1> will cause the row decoder <1> to access the local row LR_32 in the sub-array <1> in the normal manner. Then, during subsequent memory operations, when a received row address matches the stored row address of the defective memory cell 26, the fuse banks 22 output a match signal to the enable fuses 24. The enable fuses 24 then output a match signal <0> that causes the row decoder <0> to disable the local row LR_32 of the sub-array <0> and to enable the redundant row RR_0 of the sub-array <0>, thereby repairing the defective memory cell 26. At the same time, the enable fuses 24 also output an inactive match signal <1> that causes the row decoder <1> to enable the local row LR_32 of the sub-array <1> in the normal manner. As a result, a good row (i.e., local row LR_32 of the sub-array <1>) is retained using the devices and methods of the present invention, rather than discarded as taught by conventional redundancy architectures described above.

It should be noted that because one of the match signals <1> is disabled using the enable fuses 24 so that it cannot enable replacement of the local row LR_32 of the sub-array <1> with the redundant row RR_0 of the sub-array <1>, the redundant row RR_0 is itself effectively disabled by the disabling of its associated match signal <1>. Also, in accordance with the present invention, the order of the redundant rows RR_0, RR_1, RR_2, and RR_3 in the sub-array <1> is opposite to that of the redundant rows RR_0, RR_1, RR_2, and RR_3 in the sub-array <0>. As a result, the disabled redundant row RR_0 of the sub-array <1> is at the extreme edge of the sub-array <1>, where it can act as a buffer between the sub-array <1> and peripheral circuitry.

If a defective memory cell is found in the sub-array <1>, then its local row will be replaced in the sub-array <1> with the redundant row RR_2. At the same time, the redundant row RR_2 of the sub-array <0> is disabled. Since this redundant row is at the extreme edge of the sub-array <0>, it acts as a buffer between the sub-array <0> and peripheral circuitry.

The order of the redundant rows RR_0, RR_1, RR_2, and RR_3 in the sub-array <1> can be made to be opposite that of the redundant rows RR_0, RR_1, RR_2, and RR_3 in the sub-array <0> in a number of ways. For example, the order of the match signals <1> can be arranged opposite to that of the match signals <0>. Alternatively, the addressing path within the row decoder <1> can be arranged opposite that of the row decoder <0>. Of course, other arrangements to accomplish the task of re-ordering the redundant rows RR_0, RR_1, RR_2, and RR_3 in either of the sub-arrays <0> and <1> fall within the scope of the present invention. Redundant rows in adjacent sub-arrays that are ordered opposite one another in the manner described above will sometimes be referred to as being ordered in a "complementary" manner in the present application.

Thus, it can be seen that as a result of the use of the enable fuses in combination with complementary ordering of redundant rows in adjacent sub-arrays, the present inventive redundancy architecture allows redundant rows at the extreme edges of a sub-array to act as buffers between the sub-array and peripheral circuitry when repairs are made to an adjacent sub-array. It also allows good local rows that would conventionally be replaced with redundant rows to instead remain in use.

Figure 3:
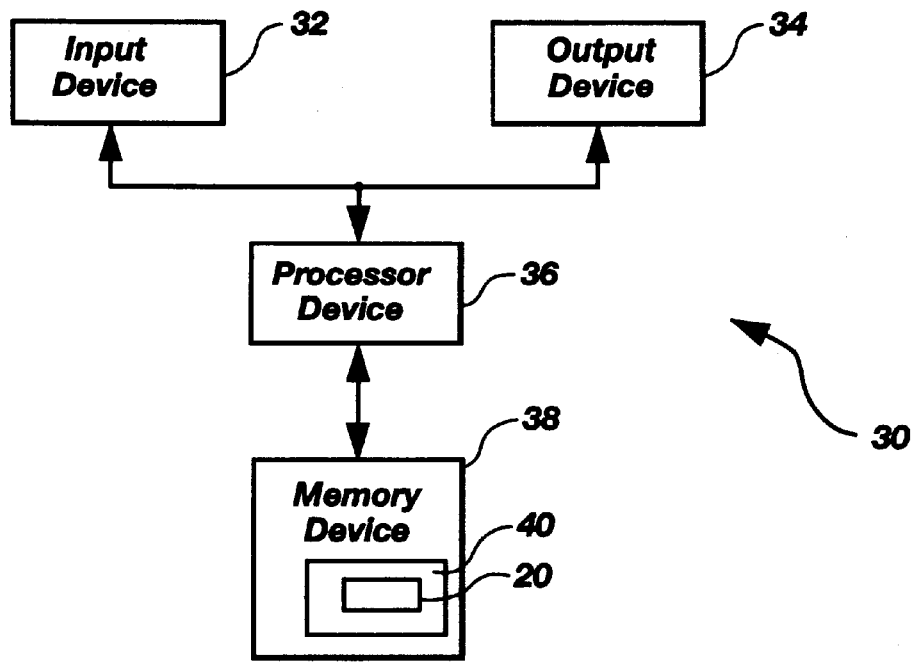
FIG. 3 is a block diagram of an electronic system including a semiconductor memory incorporating the redundancy architecture of FIG. 2.

As shown in FIG. 3, an electronic system 30 in accordance with the present invention includes an input device 32, an output device 34, a processor device 36, and a memory device 38 including a semiconductor memory 40 that incorporates the redundancy architecture 20 of FIG. 2 and comprises a Dynamic Random Access Memory (DRAM). It should be understood that the semiconductor memory 40 may comprise a wide variety of devices other than a DRAM, including, for example, a Static RAM (SRAM).

Figure 4:
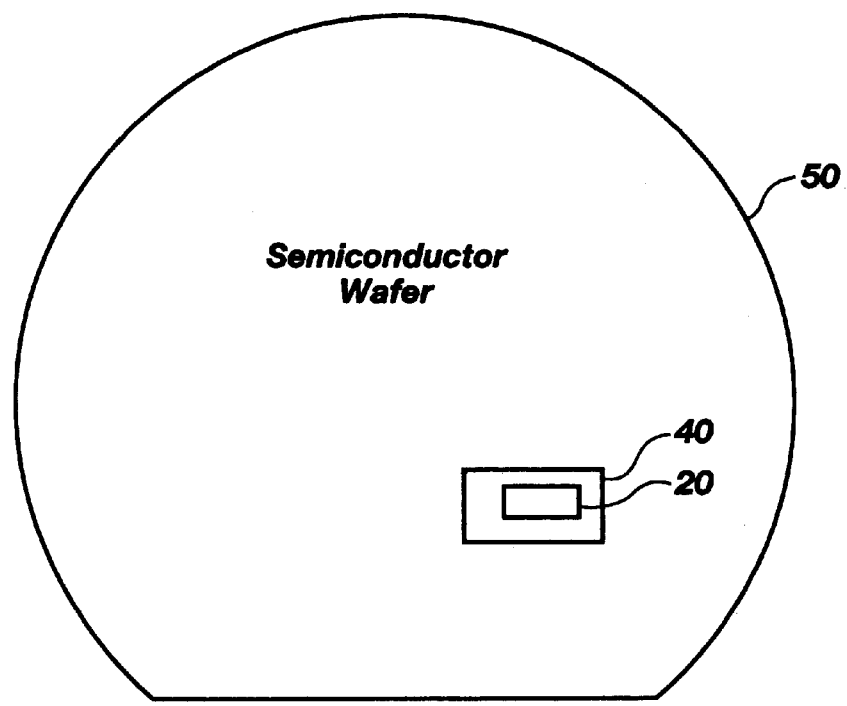
FIG. 4 is a diagram of a semiconductor wafer on which a semiconductor memory incorporating the redundancy architecture of FIG. 2 is fabricated.

As shown in FIG. 4, a semiconductor wafer 50 in accordance with the present invention includes the semiconductor memory 40 of FIG. 3 incorporating the redundancy architecture 20 of FIG. 2. Of course, it should be understood that the semiconductor memory 40 may be fabricated on semiconductor substrates other than a wafer, such as a Silicon-on-Insulator (SOI) substrate, a Silicon-on-Glass (SOG) substrate, and a Silicon-on-Sapphire (SOS) substrate.

Although the present invention has been described with reference to particular embodiments, the invention is not limited to these described embodiments. Rather, the invention is limited only by the appended claims, which include within their scope all equivalent devices or methods that operate according to the principles of the invention as described.

We claim:

1. A semiconductor memory comprising:
   first and second sub-arrays; and
   circuitry coupled to the sub-arrays adapted to store row addresses of defective rows in the sub-arrays and activate a redundant row in one of the sub-arrays in response to receiving a row address matching one of the stored defective row addresses while disabling a redundant row arranged in the other of the sub-arrays in an order complementary to that of the activated redundant row, the circuitry comprising:
      fuse banks adapted to store the row addresses of defective rows and output a match signal in response to receiving a row address matching one of the stored row addresses of defective rows;
      first and second row decoders coupled to the respective first and second sub-arrays adapted to activate redundant rows in at least one of the sub-arrays in response to receiving the match signal; and
      enable fuses coupled between the fuse banks and the row decoders adapted to conduct the match signal to the first row decoder and isolate the match signal from the second row decoder to disable activation of the redundant row in the second sub-array.

2. The semiconductor memory of claim 1 wherein the sub-arrays comprise Dynamic Random Access Memory (DRAM) sub-arrays.

3. The semiconductor memory of claim 1 wherein the sub-arrays are adjacent to one another.

4. The semiconductor memory of claim 1 wherein the enable fuses are coupled to the first row decoder in an order complementary to the order in which the enable fuses are coupled to the second row decoder so the disabled redundant row in the second sub-array is arranged in an order complementary to that of the activated redundant row in the first sub-array.

5. The semiconductor memory of claim 1 wherein the row decoders are constructed so redundant rows are activated in the first sub-array in an order complementary to the order in which redundant rows are activated in the second sub-array.

6. A redundancy architecture in a semiconductor memory having first and second sub-arrays, the redundancy architecture comprising circuitry for storing row addresses of defective rows in the sub-arrays and for activating a redundant row in one of the sub-arrays in response to receiving a row address matching one of the stored defective row addresses while disabling a redundant row arranged in the other of the sub-arrays in an order complementary to that of the activated redundant row, the circuitry comprising:
   fuse banks for storing the defective row addresses and outputting a match signal in response to receiving a row address matching the one of the stored defective row addresses;
   first and second row decoders coupled to the respective first and second sub-arrays for activating the redundant rows in the sub-arrays in response to receiving the match signal; and
   enable fuses coupled between the fuse banks and the row decoders for conducting the match signal to the row decoder coupled to the one of the sub-arrays and for isolating the match signal from the row decoder coupled to the other of the sub-arrays in order to disable activation of the redundant row in the other of the sub-arrays.

7. The redundancy architecture of claim 6 wherein the enable fuses are coupled to the first row decoder in an order complementary to the order in which the enable fuses are coupled to the second row decoder so the disabled redundant row in the other of the sub-arrays is arranged in an order complementary to that of the activated redundant row in the one of the sub-arrays.

8. The redundancy architecture of claim 6 wherein the row decoders are constructed so redundant rows are activated in the first sub-array in an order complementary to the order in which redundant rows are activated in the second sub-array.

9. A redundancy method within a semiconductor memory, the method comprising:

storing row addresses of defective rows in a pair of sub-arrays in the semiconductor memory;

activating a redundant row in one of the sub-arrays in response to receiving a row address matching one of the stored defective row addresses; and disabling activation of a redundant row arranged in the other of the sub-arrays in an order complementary to that of the activated redundant row by isolating a match signal from a row decoder associated with the other of the sub-arrays.

10. The redundancy method of claim 9 wherein the step of storing row addresses of defective rows comprises storing the row addresses using fuse banks.

11. The redundancy method of claim 9 wherein the step of activating a redundant row in the one of the sub-arrays comprises:

outputting a match signal in response to receiving the row address matching the one of the stored defective row addresses;

conducting the match signal to a row decoder associated with the one of the sub-arrays; and activating the redundant row in the one of the sub-arrays using the row decoder associated with the one of the sub-arrays in response to the match signal.

* * * * *

UNITED STATES PATENT AND TRADEMARK OFFICE
CERTIFICATE OF CORRECTION

PATENT NO : 6,005,813
DATED : December 21, 1999
INVENTOR(S) : Waller et al.

It is certified that error appears in the above-identified patent and that said Letters Patent are hereby corrected as shown below:

Column 4, line 20, change "nonvolatile" to --non-volatile--.

Signed and Sealed this

Fifteenth Day of May, 2001

*Attest:*

NICHOLAS P. GODICI

*Attesting Officer*      Acting Director of the United States Patent and Trademark Office